United States Patent
Deimling

(10) Patent No.: US 7,429,861 B2
(45) Date of Patent: Sep. 30, 2008

(54) MR SYSTEM AND OPERATING METHOD THEREFOR ALLOWING SELECTION OF POINTS IN TIME OF SIGNAL READOUT

(75) Inventor: Michael Deimling, Möhrendorf (DE)

(73) Assignee: Siemens Aktiengesellschaft, Munich (DE)

(*) Notice: Subject to any disclaimer, the term of this patent is extended or adjusted under 35 U.S.C. 154(b) by 23 days.

(21) Appl. No.: 11/581,807

(22) Filed: Oct. 17, 2006

(65) Prior Publication Data

US 2007/0100230 A1    May 3, 2007

(30) Foreign Application Priority Data

Oct. 17, 2005    (DE)    ........................ 10 2005 049 587

(51) Int. Cl.
*G01V 3/00*    (2006.01)
(52) U.S. Cl. .................................... 324/307
(58) Field of Classification Search ......... 324/300–322; 600/410–435
See application file for complete search history.

(56) References Cited

U.S. PATENT DOCUMENTS 6,603,990 B2    8/2003    Zhang et al.

2005/0215882 A1    9/2005    Chenevert et al.

FOREIGN PATENT DOCUMENTS

| DE | 198 08 662 | 9/1999 |
|---|---|---|
| EP | 0 745 865 | 5/1996 |
| EP | 1 566 652 | 1/2005 |

*Primary Examiner*—Diego Gutierrez
*Assistant Examiner*—Dixomara Vargas
(74) *Attorney, Agent, or Firm*—Schiff Hardin LLP

(57) ABSTRACT

In a method for operation of a magnetic resonance system, radio-frequency excitation pulses are radiated into a tissue that contains at least a first tissue type with a first resonance frequency and a second tissue type with a second resonance frequency. A readout gradient is activated with polarity changing at least twice between two radio-frequency excitation pulses, to read out the signals of the at least two gradient echoes at points in time of the signal readout selected such that the gradient echoes of both tissue types have the same phase position, and/or the phase position of the gradient echoes of the first tissue lies counter to the phase position of the gradient echoes of the second tissue type, or the phase positions of the gradient echoes of both tissue types relative to one another are not taken into account in the selection of the signal readout.

9 Claims, 2 Drawing Sheets

MR SYSTEM AND OPERATING METHOD THEREFOR ALLOWING SELECTION OF POINTS IN TIME OF SIGNAL READOUT

BACKGROUND OF THE INVENTION

1. Field of the Invention

The present invention concerns a method for operation of a magnetic resonance (MR) system and in particular concerns a method for generation of MR images using gradient echoes.

2. Description of the Prior Art

For specific diagnostic questions, a T2* weighting is desired in magnetic resonance tomography. T2* stands for the time constant for the loss of the phase coherency of the spin due to an interaction of magnetic field inhomogeneities making use of this phase coherency loss, with and spin-spin transverse relaxation. Gradient echo sequences are typically used for long echo times TE being required for a T2* weighting. This in turn means that long repetition times TR and small excitation angles α (to avoid saturation effects) must be used.

Furthermore, a pulse sequence is known as a MEDIC sequence is known described, for example, in DE 198 08 662. In such a MEDIC sequence, a number of bipolar readout gradients are switched in series, and each bipolar readout gradient generates a gradient echo. Given a number of bipolar gradients, this leads to gradient echoes at different echo points in time TE.

Furthermore, use of the chemical shift in NMR spectroscopy is known. The chemical shift is the shift in the resonance frequency of different tissue dependent on the type of the chemical bond in which the atom under investigation participates, the resonant frequency shift being proportional to the field strength. In the human body, only hydrogen nuclei of the free water and in fat compounds contribute to the signal, and thus to the MR image. The relative resonant frequency difference δ is approximately 3 ppm (parts per million), meaning 130 Hz given a field strength of 1.0 T.

In the examination of tissue with fat and water portions, the tissue portion of the water and the tissue portion of the fat have different resonant frequencies. These different resonant frequencies mean that, upon deflection of the spins by a radio-frequency excitation pulse, these spins precess with different frequencies. This leads to the situation that the phase position of the water signal portions varies with the time relative to the phase position of the signal portions of the fat. Phase coherency of the signal portions of the water and of the fat predominate dependent on the time, which means that the signal portions of both tissue parts appear in the same direction (what are known as in-phase conditions). Furthermore, at another point in time it can occur that the phase positions of the two tissue types are offset by 180° relative to one another, such that the magnetization of the water tissue is situated opposite (counter) to the magnetization of the fatty tissue (what are known as opposed-phase conditions).

If the phase position of both tissue types is the same, the resulting overall magnetization (and thus the overall signal) is greater while the overall signal is reduced given opposite alignment of the two magnetizations. This leads to different contrasts in the magnetic resonance image, dependent on the echo time.

As mentioned above, in the MEDIC sequence a number of gradient echoes are generated at different echo times TE. After Fourier transformation and absolute value generation (magnitude generation), the normalized sum of the squares of the echo data is output as an image. The phase position of the two tissue types (fat and water) relative to one another changes continuously with time, such that given multi-gradient echo sequences at different times T various image contrasts arise. Conventionally, the echoes have been measured in succession in the MEDIC sequence without the arising phase positions of the fat protons and water protons being taken into account. The composite MEDIC image generally has a mixed contrast.

SUMMARY OF THE INVENTION

For some questions it is desirable to have, for example, a pure T2* contrast. Furthermore, it would be desirable for the operating personnel to be able to influence which contrast the acquired MEDIC image has. An object of the present invention is to provide a method for operating a magnetic resonance system that achieves these goods.

This object is achieved in accordance with the invention by a method for operation of a magnetic resonance system that includes the following steps. A radio-frequency excitation pulse is radiated into a tissue that composed of at least two different tissue types, the first tissue type exhibiting a first resonant frequency and the second tissue type exhibiting a second resonant frequency. A readout gradient with polarity changing at least twice is switched between two radio-frequency excitation pulses, so a gradient echo of the tissue is generated by each bipolar gradient switching. The echo time corresponds to the time duration from a radio-frequency excitation pulse to a gradient echo. The signals of the at least two gradient echoes are readout by activating readout gradient between two radio-frequency excitation pulses. According to the invention, the point in time of the signal readout can now be selected, and points in time for readout of the aforementioned gradient echoes are selected such that the gradient echoes of both tissue types have the same phase position. This means a user is given a selection possibility as to which phase position the two echoes should have relative to one another. The point in time of the signal readout likewise can be selected such that the phase position of the gradient echoes of the first tissue type is counter to the phase position of the gradient echoes of the second tissue type. Furthermore, the points in time of the signal readout can be selected such that the phase positions of the gradient echoes of both tissue types relative to one another are not taken into account in the selection of the signal readout. This latter method corresponds to known methods in MEDIC sequences in which, in the signal acquisition, no differentiation is made between identical phase positions and contrary phase positions of the two tissue types. According to the invention, however, the magnetic resonance system can also be operated such that the operating personnel can select which contrast the imaging sequence should have.

It is possible to take into account only the signal portions in which the water protons and the fat protons appear in the same direction; it is likewise possible to take into account only the signal portions in which the water protons appear in the direction opposite to the fat protons; the third, classical method according to the prior art is likewise possible, in which the phase position of the two tissue portions relative to one another was not taken into account. If, in the acquisition, one is limited to the signals in which the fat protons are in phase with the water protons, a T2* parameter image can also be calculated from the calculated images since in this case a pure T2* weighting exists.

Furthermore, phase coding gradients for phase coding of the gradient echoes are switched, as they are typically required for image generation.

According to a further embodiment, the absolute value (magnitude) of each read-out signal is calculated, and the read-out signals are combined by calculation of the square root of the sum of the squares of the individual signals (gradient echoes). For the sum calculation, only signals are taken into account in which the gradient echoes of both tissue types have the same phase position. This means that only the first option is selected in the above selection, meaning that all calculated images are generated on the basis of signals in which the phase positions of the water protons and fat protons are identical.

It is likewise possible to calculate the absolute value of the read-out signals and to combine the read-out signals by calculation of the square root from the sum of the squares of the signals, with only signals are taken into account in which the phase positions of the gradient echoes of the tissue types are opposite being used for the summation. This means that only the second option is selected, such that only opposed-phase images are generated.

According to a further embodiment, instead of the generation of only opposed-phase images or of only in-phase images, both echoes are read out. For example, it is thus possible to read out both the gradient echoes in which both tissue types have the same phase position and the gradient echoes in which both tissue types have opposite phase positions.

This is possible in an efficient manner by simultaneous measurement in an imaging sequence, with gradient echoes in which both tissue types have the same phase position being read out at one polarity of the readout gradients while the gradient echoes in which the two tissue types have opposite phase positions being read out at the other, opposite polarity of the readout gradients. The operating personnel or the diagnosing physician thus acquires both in-phase images and opposed-phase images in a short acquisition time, so medical questions can be evacuated from the different contrasts.

According to a further preferred embodiment of the invention, the readout gradient is switched such that if a movement of the examined spins with constant speed occurs, this does not influence the readout signal. This switching of the gradients (known as flux compensation) prevents the phase development of the moving spins at the readout point in time from developing differently from the phase development of non-moving spins.

The invention furthermore concerns a magnetic resonance system for examination of a tissue by means of magnetic resonance, that magnetic resonance system having a radio-frequency excitation pulse transmission and reception unit and a gradient generation unit for switching of the various gradient fields (in particular for switching of the readout gradients as described above in order to generate the various gradient echoes). Furthermore, a selection unit is provided that allows a selection as to whether MR images are to be generated in which the phase position of the two varying tissue types is identical or whether MR images are generated in which the phase position of the first tissue is opposite to the phase position of the gradient echo of the second tissue, or whether MR images are generated wherein the phase positions of the two tissue types relative to one another is not taken into account.

DESCRIPTION OF THE PREFERRED EMBODIMENTS

Figure 1:
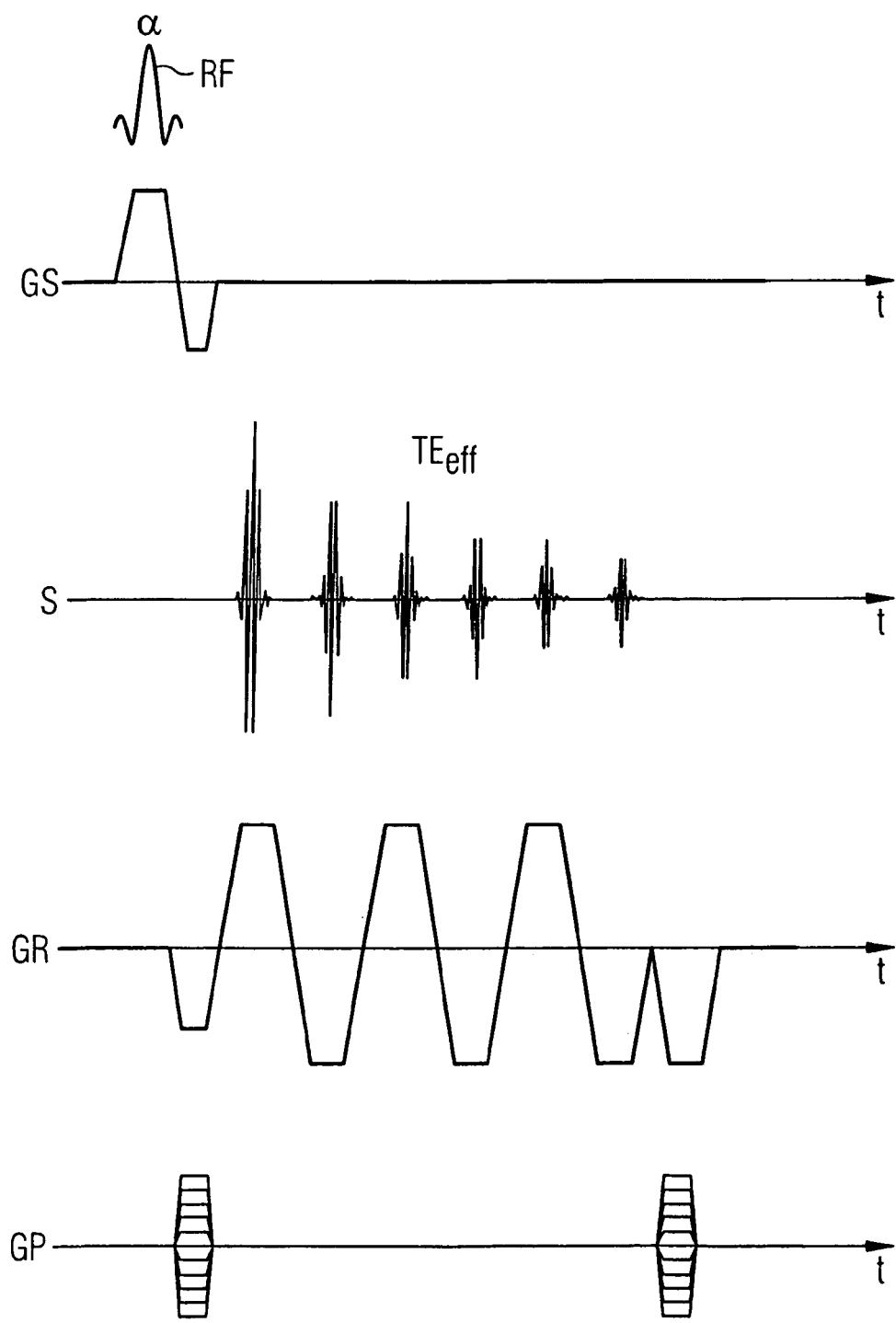
FIG. 1 schematically illustrates the switching gradients in a MEDIC sequence.

An exemplary embodiment of a pulse sequence with which a number of gradient echoes can be acquired is shown in FIG. 1. As in a conventional gradient echo sequence, in each sequence repetition a radio-frequency excitation pulse RF is radiated while a slice-selection gradient GS is activated (switched). A specific slice of an examined tissue is thereby selected, with (for example) fat protons and water protons being present in this examined tissue. As in the conventional gradient echo sequence, negative switchings of the slice-selection gradient GS and of the readout gradient GR as well as of the phase coding gradient GP follow the positive slice-selection gradient GS. The signal curve that results from the switchings of the gradients is furthermore shown in FIG. 1. In total, in the shown example six gradient echoes are generated via the repeated switching of a positive readout gradient and of a negative readout gradient. After the last gradient echo, the phase coding gradient GP is again reset and the phase coherency is destroyed by a further switching of the readout gradient.

The repetition of the shown sequence progression ensues with a repetition time TR that is selected such that an equilibrium state of the magnetization arises. In order to avoid a saturation of the magnetization, the radio-frequency excitation pulses RF exhibit a flip angle $\alpha$ of distinctly less than 90°.

The imaging sequence shown in FIG. 1 is specified in more detail in DE 198 08 662 A1, so that a more detailed description of the pulse sequence is not necessary.

Figure 2A:
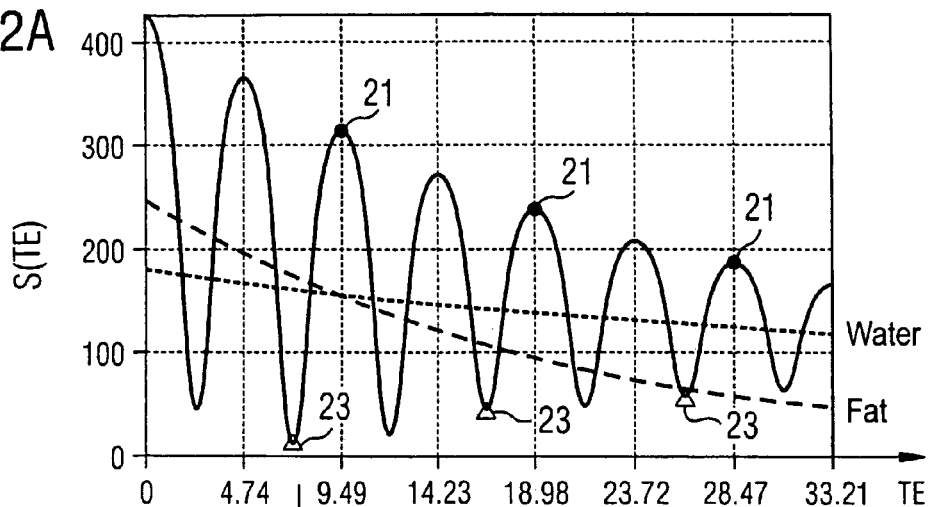
FIGS. 2a-2d show the phase development of two different tissue types as well as the switching of the readout gradient in accordance with the invention.

When the tissue excited by the radio-frequency pulse RF contains fat protons and water protons, these have different resonant frequencies due to their different chemical environments. Due to the different respective precession frequencies, the phase position of both tissue types relative to one another also is different. This is shown as an example in FIG. 2a. In FIG. 2a, the resulting vector sum S from fat proportion $\lambda$ and the water proportion $(1-\lambda)$ in the examined tissue is plotted dependent on the echo time TE. The resulting vector sum S is a function of the repetition time TR, the echo time TI, the flip angle $\alpha$, the relaxation times T1 and T2, the basic field B0, the fat proportion $\lambda$ and the chemical shift $\sigma$. The signal develops according to the following formula:

$$S(TE_j) = \sqrt{W^2 + F^2 - 2WF\cos(\pi - \Phi(TE_j))},$$

wherein W describes the gradient echo sequence of the water and F describes the gradient echo sequence of the fat and $\Phi$ is the precession angle of the non-resonant components.

The echo points in time at which the tissue components of the water have the same phase position as the tissue components of the fat (such that both signal portions add together) are respectively shown in FIG. 2a with 32. In FIG. 2a, the signal curve is exemplarily shown, whereby a basic magnetic field B0 of 1.5 T was assumed for the calculation of the various echo times. As mentioned above, the chemical shift between the fat protons and water protons is 3.3 ppm, the tilt angle $\alpha$ was 30°, the repetition time TR was 700 ms. The desired time interval between two echoes $\Delta TE$ is dependent on the chemical shift $\sigma$, the basic magnetic field B0 and the effective echo time $TE_{eff}$, the effective echo time being calculated according to $TE_{eff}$=the point in time of the last acquired echo, divided by 2. Furthermore, the echo-echo interval is dependent on the field of view FoV and the selected matrix size and on the bandwidth per image point, which in turn depends on the length of the readout interval in which the signal is read out.

For example, FIG. 2 shows the switching of the readout gradient GR when all echoes for which the condition known as the in-phase condition exists (meaning that the phase positions of the fat protons and water protons are the same) should be acquired. In the embodiment shown in FIG. 2b, the readout gradient is simultaneously switched such that a flux compensation of the moving spins is effected. For this reason the first echo cannot be acquired since at this point in time the negative readout gradient is switched for flux compensation. The signal readout ensues during the positive readout gradient and is represented with ADC in FIG. 2b. Furthermore, in FIG. 2b the gradient echoes 22 are shown that are acquired during the signal readout ADC. In the example selected in FIG. 2a, given a basic magnetic field strength of 1.5 T a first usable echo results at 9.49 s, the second results at 18.98 s and the third results at 28.47 s. The effective echo time $TE_{eff}$ for the in-phase condition is therewith 14.23 ms.

Figure 2B:
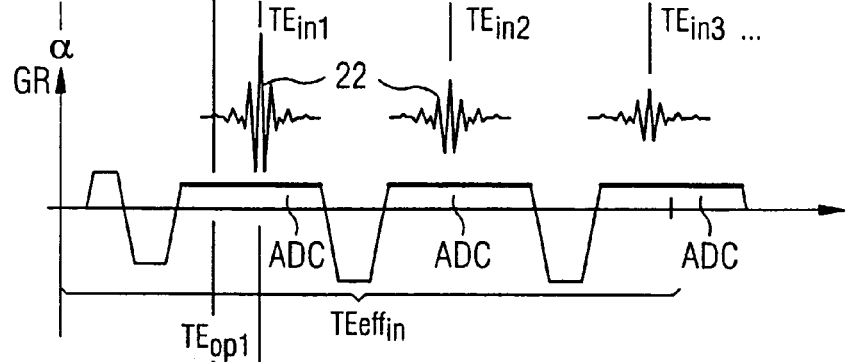

As can be seen from FIGS. 2a and 2b, the realization is dependent on which gradient amplitude G is available and with which speed this gradient amplitude can be deactivated and activated (switched off and on). The formula for calculation of the echo time is as follows for the in-phase conditions:

$$TE_{in}(j)=j2/(\gamma \sigma B0),$$

wherein $\gamma$ is the gyromagnetic ratio and $\sigma$ is the chemical shift. As shown in FIG. 2a, echoes hereby result with the in-phase condition at 4.74 ms, 9.49 ms, 14.23 ms, 18.98 ms, 23.72 ms and 28.47 ms. Due to the gradient switching in the readout direction, only the echoes at the points in time at 9.49, 18.98 and 28.47 ms can be used for image calculation.

As can be seen from FIGS. 2a and 2b, dependent on various parameters of the magnetic resonance system one can calculate when an in-phase condition of the fat protons and water protons exists. When the readout gradient GR of the imaging sequence shown in FIG. 1 is now selected as is shown in FIG. 2b, only gradient echo sequences in which the fat protons and water protons have the same phase position are selected.

Furthermore the echo points in time 23 at which the phase position of the fat protons is aligned opposite (counter) to the phase position of the water protons (such that overall a signal reduction results) are shown in FIG. 2a. The echo times TE for this opposed-phase condition is calculated as follows:

$$TE_{op}(j)=(2j-1)\cdot skip/(2\gamma \sigma B0).$$

For 1.5 T, echo times of 7.12; 11.86; 16.60; 21.35; 26.09 and 30.84 ms thus result for echoes with opposite phase position. When the gradient switching now ensues as in FIG. 2c, the opposed-phase echoes at the points in time 7.12 ms, 16.61 ms and 26.09 ms can be used. These gradient echoes are exemplarily represented in FIG. 2c with reference character 24. The readout gradient GR is switched in FIG. 2c such that the signal readout ADC ensues at the points in time of these gradient echoes 24.

Figure 2C:
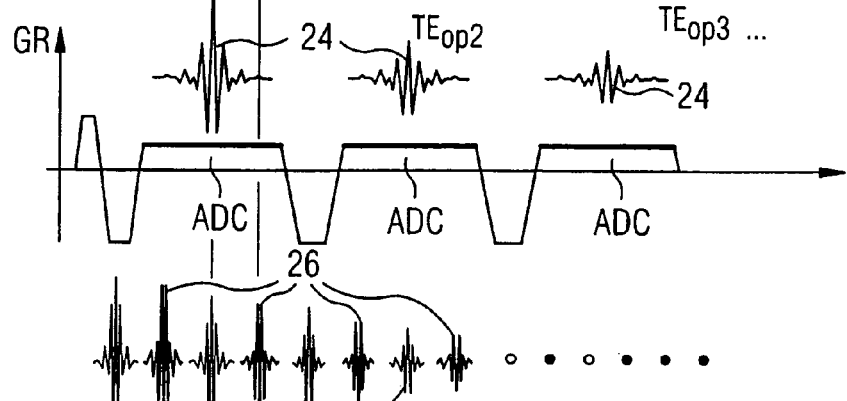

If the readout gradient is now switched as shown in FIG. 2c, the magnetic resonance system MR can generate images based on signals that are based only on opposed-phase signal portions. The operating personnel can decide, for example, that only in-phase or only opposed-phase images would be of interest, and the readout gradient and the signal readout are then selected either as shown in FIG. 2b or as shown in 2c.

Figure 2D:
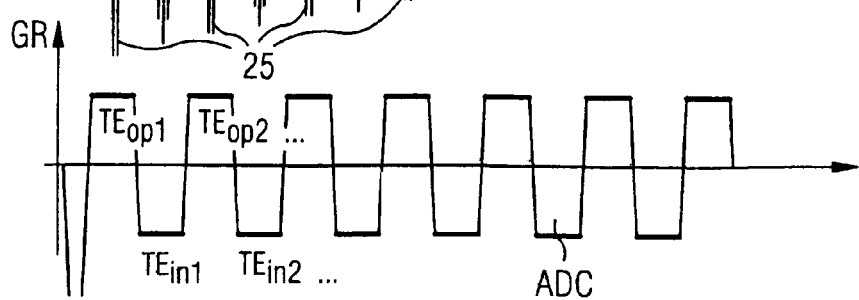

The switching of an imaging sequence in which in-phase images and opposed-phase images are simultaneously acquired is shown in FIG. 2d. In FIG. 2d, the reference characters 25 show the echoes for the opposed-phase images that, for example, can be read out during the positive gradient switchings. The gradient echoes 26 can be simultaneously acquired during the negative switching of the readout gradient GR. An MR image in which the fat protons and water protons appear in the same direction can then be generated from the in-phase signal portions while images based on the opposed-phase signal portions whose fat portions and water portions appear in opposing directions furthermore can be generated. As shown in FIG. 2d, this is possible in a very short time span since signals are read out both during the positive readout gradient and during the negative readout gradient.

In summary, the invention enables the option of generating MR images that are calculated only with signal portions in which tissues with different resonance frequencies have the same phase position. It is likewise possible to generate MR images based on the signals in which two different tissue types have an opposite phase position. Furthermore, the typical case (that the phase position of both tissue types is not taken into account) is naturally possible.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for operating a magnetic resonance system, comprising the steps of:
    radiating radio-frequency excitation pulses into tissue comprising at least a first tissue type having a first resonant frequency and a second tissue type, different from said first tissue type, having a second resonant frequency;
    activating a readout gradient with a polarity that changes at least twice between two successive ones of said radio-frequency excitation pulses, and thereby causing said tissue to produce a gradient echo in the tissue with each bipolar switching of said readout gradient, with an echo time corresponding to a time duration from one of said radio-frequency excitation pulses to said gradient echo;
    reading out radio-frequency signals produced by said at least two gradient echoes to obtain magnetic resonance image data representing said tissue by activating a readout gradient between said two successive ones of said radio-frequency excitation pulses;
    selecting respective points in time of the readout of said radio-frequency signals to cause at least one of the gradient echoes of said first and second tissue types to have a same phase position, or a phase position of the gradient echoes of the first tissue to be countered to a phase position of the gradient echoes of the second tissue type, or selecting said points in time of said signal readout without the respective phase positions of the gradient echoes of the first and second tissue types relative to each other being taken into account; and
    making said magnetic resonance image data available as an electronic dataset in a form allowing reconstruction of an image of said tissue therefrom.

2. A method as claimed in claim 1 comprising additionally activating a phase coding gradient that phase encodes said gradient echoes.

3. A method as claimed in claim 1 comprising calculating a magnitude of the read-out signals and combining the read-out signals by calculating a square root of a sum of the squares of the read-out signals, using only signals for which the gradient echoes of said first and second tissue types have said same phase position.

4. A method as claimed in claim 1 comprising calculating a magnitude of the read-out signals and combining the read-out signals by calculating a square root of the sum of the squares of the read-out signals, using only signals in which the respective phase positions of the gradient echoes of the first and second tissue types are opposite each other.

5. A method as claimed in claim 1 comprising selectively reading out only gradient echoes in which said first and second types have said same phase position, or only gradient echoes for which the respective phase positions of the gradient echoes of the first and second tissue types are opposite to each other.

6. A method as claimed in claim 1 comprising reading out both gradient echoes for which said first and second tissue types have said same phase position and gradient echoes for which both said first and second tissue types have said opposite phase position.

7. A method as claimed in claim 6 comprising reading out said gradient echoes for which both of said first and second tissue types have said same phase position at a first polarity of said readout gradient and reading out gradient echoes for which both said first and second tissue types have opposite phase positions at a second, opposite polarity of the readout gradient.

8. A method as claimed in claim 1 comprising switching said readout gradients to prevent flux movements of nuclei of said first and second tissue types from influencing the radio-frequency signal that is read out.

9. A magnetic resonance system comprising:
a magnetic resonance scanner having a radio-frequency antenna and a gradient coil system;
a control unit configured to operate said magnetic resonance scanner to cause said radio-frequency antenna to radiate radio-frequency excitation pulses into tissue comprising at least a first tissue type having a first resonant frequency and a second tissue type, different from said first tissue type, having a second resonant frequency, and to cause said gradient coil system to activate a readout gradient with a polarity that changes at least twice between two successive ones of said radio-frequency excitation pulses, and thereby causing said tissue to produce a gradient echo in the tissue with each bipolar switching of said readout gradient, with an echo time corresponding to a time duration from one of said radio-frequency excitation pulses to said gradient echo, and to read out radio-frequency signals produced by said at least two gradient echoes by activating a readout gradient between said two successive ones of said radio-frequency excitation pulses; and
an input unit connected to said control unit allowing selection of respective points in time of the readout of said radio-frequency signals to cause at least one of the gradient echoes of said first and second tissue types to have a same phase position, or a phase position of the gradient echoes of the first tissue to be countered to a phase position of the gradient echoes of the second tissue type, or selecting said points in time of said signal readout without the respective phase positions of the gradient echoes of the first and second tissue types relative to each other being taken into account.

* * * * *